(12) United States Patent
Voinigescu et al.

(10) Patent No.: US 8,139,625 B2
(45) Date of Patent: Mar. 20, 2012

(54) HIGH FREQUENCY SYSTEM ON CHIP TRANSCEIVER

(76) Inventors: Sorin P. Voinigescu, Toronto (CA);
Alexandre Timonov, Toronto (CA);
Sean T. Nicolson, Mountain View, CA
(US); Adrian Nachman, Toronto (CA);
Ekaterina Laskin, Toronto (CA);
George V. Elefthriades, Toronto (CA)

( * ) Notice: Subject to any disclaimer, the term of this patent is extended or adjusted under 35 U.S.C. 154(b) by 293 days.

(21) Appl. No.: 12/626,128

(22) Filed: Nov. 25, 2009

(65) Prior Publication Data

US 2010/0158084 A1   Jun. 24, 2010

Related U.S. Application Data

(63) Continuation of application No. PCT/CA2008/000994, filed on May 26, 2008.

(60) Provisional application No. 60/940,275, filed on May 25, 2007, provisional application No. 60/941,459, filed on Jun. 1, 2007.

(51) Int. Cl.
*H04L 5/16* (2006.01)
(52) U.S. Cl. ........................................................ 375/219
(58) Field of Classification Search .................. 375/219, 375/257–258, 283, 377
See application file for complete search history.

(56) References Cited

U.S. PATENT DOCUMENTS

| | | | | |
|---|---|---|---|---|
| 7,274,913 | B2* | 9/2007 | Marholev et al. | 455/78 |
| 7,283,595 | B2* | 10/2007 | Jun | 375/295 |
| 7,881,677 | B2* | 2/2011 | Marholev et al. | 455/78 |
| 2009/0175378 | A1* | 7/2009 | Staszewski et al. | 375/295 |

* cited by examiner

*Primary Examiner* — Khanh C Tran
(74) *Attorney, Agent, or Firm* — Gowling LaFleur Henderson LLP

(57) ABSTRACT

A system-on-chip (SOC) transceiver is provided. The transceiver is configured to operate in excess of 100 GHz and comprising the following components. A quadrature oscillator is configured to generate a fundamental frequency and a second harmonic frequency and comprises at least a pair of high frequency outputs at said second harmonic frequency. At least the second harmonic frequency exceeds 100 GHz. A transmission output is coupled to one of the high frequency outputs for transmitting an output signal at the second harmonic frequency. A transmission signal transformer is coupled to the other one of the high frequency outputs and configured to generate a differential oscillator signal at the second harmonic frequency. A radio frequency input receives radio frequency signals at the transceiver from an antenna. A radio frequency signal transformer coupled to the radio frequency input is configured to generate a differential radio frequency signal at the radio frequency. A mixer is configure to compare the differential radio frequency signal with the differential oscillator signal and output the comparison as an intermediate frequency signal.

11 Claims, 9 Drawing Sheets

HIGH FREQUENCY SYSTEM ON CHIP TRANSCEIVER

The present invention relates generally to high frequency transceivers and specifically to a system on chip (SOC) implementation of such transceivers. The application is a continuation of Patent Cooperation Treaty Application No. PCT/CA2008/000994 filed 26 May 2008, which claims priority from U.S. Provisional Application Nos. 60/940,275 filed May 25, 2007 and 60/941,459 filed Jun. 1, 2007.

BACKGROUND

As the electronics industry continues to progress, higher bandwidth communication is needed to satisfy the requirements of consumer applications. For example, in imaging applications higher bandwidth affords improved imaging resolution. Inevitably, to meet this demand for bandwidth, front-end radio circuits have to operate at increasingly higher frequencies.

However, implementing transceivers capable of operating at sufficient frequencies, for example greater than 100 GHz, comes at the expense of cost and size. Specifically, implementing a radio with a sufficiently high frequency would require implementation of tubes, laser or expensive III-IV semiconductors.

Accordingly, it will be appreciated that there is a need for a "system-on-chip" (SOC) design for a radio circuit capable of operating at frequencies greater than 100 GHz.

SUMMARY

Accordingly, a transceiver is described that is capable of operating simultaneously at frequencies of 80 GHz and 160 GHz. The transceiver is described as operating at these frequencies for convenience and ease of explanation only, and a person of ordinary skill in the art will appreciate that other frequencies may also be implemented.

By employing two widely different frequencies, such as 80 GHz and 160 GHz, a transceiver used for imaging can provide more detailed information about electromagnetic radiation absorption rates and the composition of the materials inside the object being imaged.

Further, along with higher resolution, 160 GHz transceivers enjoy the advantage of being easily integrated with antennas, whose area has become sufficiently small to be economically implemented on chip and formed into arrays. The arrays can be used for a number of implementations including active imaging in security and medical applications.

Yet further, the 160 GHz range provides relatively low atmospheric absorption and allows for reuse of existing circuit blacks, as will be described in detail further on.

In accordance with an aspect of the present invention, there is provided a system-on-chip (SOC) transceiver configured to operate in excess of 100 GHz, the transceiver comprising: a quadrature oscillator configured to generate a fundamental frequency and a second harmonic frequency and comprising at least a pair of high frequency outputs at said second harmonic frequency, wherein at least the second harmonic frequency exceeds 100 GHz; a transmission output coupled to one of the high frequency outputs for transmitting an output signal at said second harmonic frequency; a transmission signal transformer coupled to the other one of the high frequency outputs, the transmission signal transformer configured to generate a differential oscillator signal at the second harmonic frequency; a radio frequency input for receiving radio frequency signals at the transceiver from an antenna; a radio frequency signal transformer coupled to the radio frequency input, the radio frequency transformer configured to generate a differential radio frequency signal at the radio frequency; a mixer configured to compare the differential radio frequency signal with the differential oscillator signal and output the comparison as an intermediate frequency signal

BRIEF DESCRIPTION OF THE DRAWINGS

An embodiment of the invention will now be described by way of example only with reference to the following drawings in which.

DETAILED DESCRIPTION OF THE PREFERRED EMBODIMENT

Figure 1:
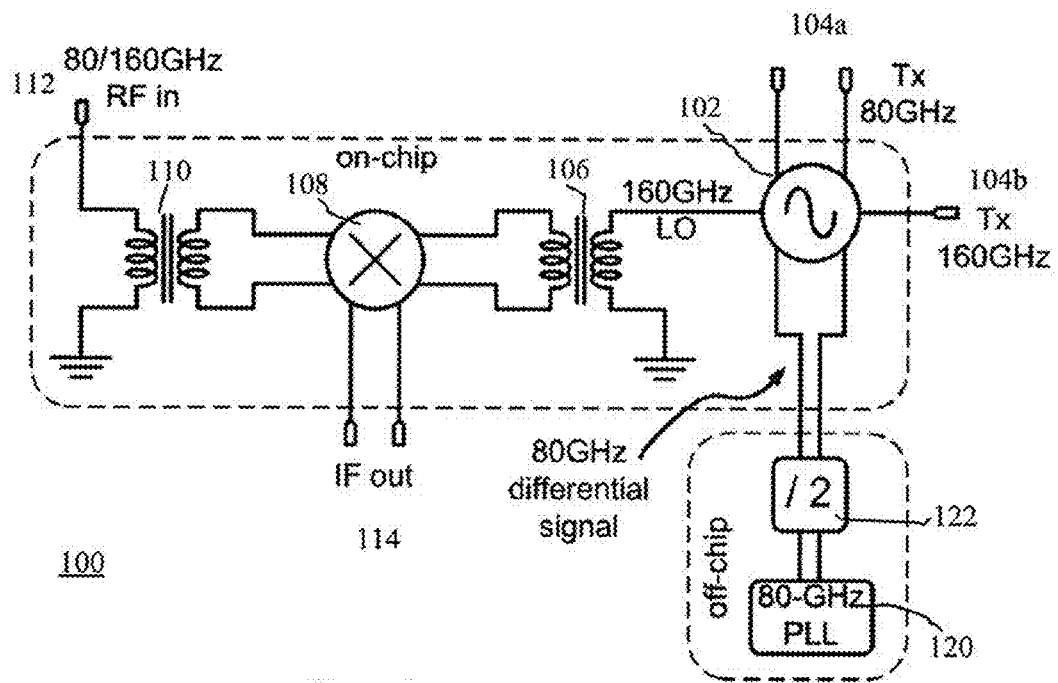
FIG. 1 is a block diagram of a transceiver.

For convenience, like numerals in the description refer to like structures in the drawings.

As described in the background, integrating a transceiver circuit at frequencies above 100 GHz poses a significant challenge in terms of local oscillator (LO) clock distribution, power, and area. Accordingly, a transceiver circuit architecture is proposed that overcomes these problems. In the present embodiment, the proposed transceiver circuit utilizes the generation of four quadrature signals at a fundamental frequency (80 GHz) together with a differential signal at a second harmonic (160 GHz). Since only one voltage controlled oscillator (VCO) is involved, its six outputs can be locked to a single 80-GHz phase-locked loop (PLL), thus saving power and area.

Referring to FIG. 1, a block diagram of the transceiver is illustrated generally by numeral 100. The transceiver 100 includes a local oscillator 102, a transmission output 104, an output signal transformer 106, a mixer 108, a received signal transformer 110 and a radio frequency (RF) signal input 112. In the present embodiment the transmission output 104 includes a differential output 104a and a single-ended output 104b. The local oscillator 102 is also couple to a PLL 120 via a divider 122. However, in the present embodiment, the PLL 120 and the divider 122 are "off-chip".

In the receiver 100, a four (4) 80 GHz signals and a pair of 160 GHz signals are generated on chip using the local oscillator 102. In the present embodiment, the local oscillator 102 is a quadrature oscillator. One of the 160 GHz is converted through the output signal transformer 106 to differential output signal that drives the mixer 108 differentially. The second 160 GHz signal is provided as the single-ended output 104b.

Two of the 80 GHz quadrature signals form an 80 GHz signal at the differential output 104a. The remaining two 80 GHz outputs of the local oscillator 102 can be used to drive the divider 122. Thus, simultaneous 80 and 160 GHz transmitter and receiver operation is achieved. Alternatively, rather than output a differential 80 GHz the two 80 GHz quadrature signals can be terminated on-chip.

A radio frequency (RF) signal received at the RF signal input 112 is converted through the received signal transformer 110 to a received differential signal that drives the mixer 108.

As is known in the art, mixers provide frequency translation. Specifically, they allow conversion of high frequency signals, such as RF signals, to lower intermediate frequencies (IF). Accordingly, in the present embodiment, the mixer 110 is configured to determine the difference between the received differential signal and the differential oscillator signal. The difference between these two signals constitutes a differential IF output of the mixer 108. In the present embodiment, the differential IF output 114 is matched on-chip over a 10 GHz band. Also, no IF buffer is incorporated in this version of the transceiver 100.

80 GHz PLLs have already been developed for automotive radar transceivers, which operate at 77 to 79 GHz. Accordingly, it will be appreciated that such a PLL is known in the art and need not be described in detail.

Oscillator

The oscillator relies on a novel Colpitts topology with four-fold symmetry, and a star connection of the four tank inductors. Due to the built-in symmetry, the four 80 GHz fundamental frequency signals operate in quadrature while the two second harmonic signals at 160 GHz are 180° out of phase. Cascode transistors are employed to adequately isolate the outputs from the tank, and to allow for the differential collection of the 160 GHz signals. All transistors are biased at peak-$f_T$ current density to obtain the maximum output swing. Design of the quadrature oscillator is described in detail as follows.

The quadrature oscillator provides a topology that simplifies distribution of the local oscillator 102 among transceivers. It should be noted that for the transceiver topologies discussed herein, the quadrature phase relationship between the two 80 GHz differential outputs of the oscillator is not critical for correct operation.

The most common quadrature oscillator topology consists of two inter-locked cross-coupled LC oscillators. However, experimental data have shown that differential Colpitts oscillators exhibit superior performance in terms of phase noise, tuning range, temperature stability, and operation at mm-wave frequencies. To date, quadrature Colpitts oscillators have been implemented by injection locking two differential oscillators, as opposed to a quadruple-push oscillator, at lower frequencies than the oscillator presented here.

Figure 2:
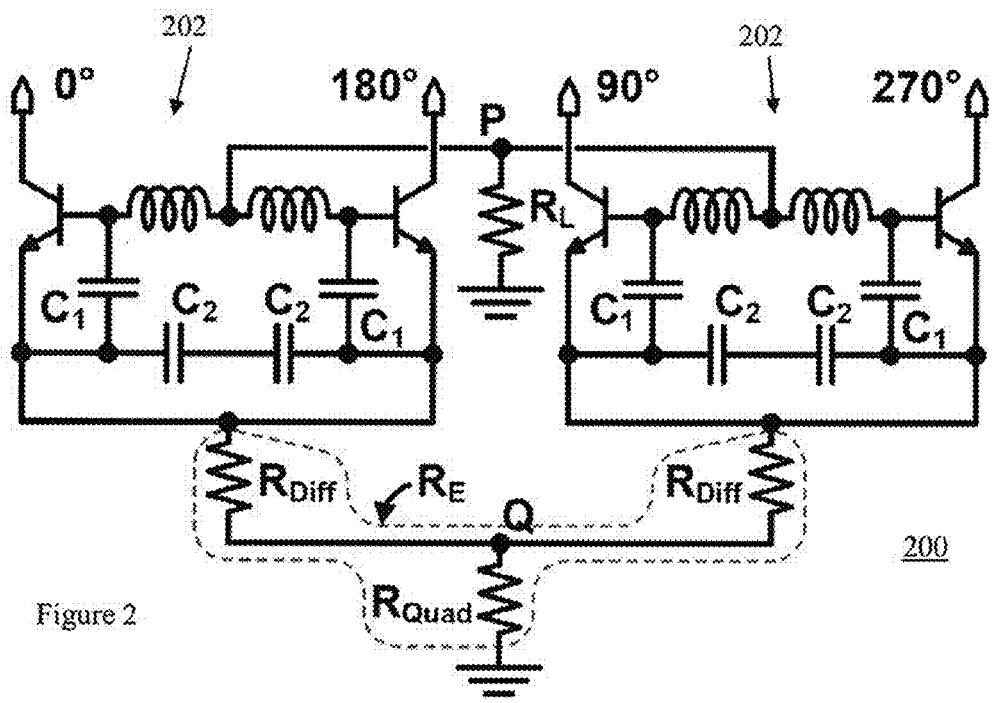
FIG. 2 is a schematic of a quadrature oscillator.

Therefore, the present embodiment takes advantage of the Colpitts topology and, expanding on a 3-push oscillator concept, we are proposing a new quadrature oscillator topology. Referring to FIG. 2, a schematic of a quadrature oscillator is illustrated generally by numeral 200. The quadrature oscillator 200 comprises two coupled, differential Colpitts oscillators 202. Each differential oscillator includes a common-mode resistor $R_{Diff}$, configured to ensure that their outputs are 180° out of phase.

Similarly, resistor $R_{Quad}$, is common to both differential oscillators and, therefore, shared by all four Colpitts sub-oscillators. Resistor $R_{Quad}$ is configured to help to establish a 90° phase difference between the two differential halves of the quadrature oscillator. The common-mode resistors $R_{Diff}$, along with the star-connection of the tank inductors at node P, ensure that the four oscillator outputs can be locked in quadrature, as will be described.

The proposed quadrature oscillator can be analyzed using modal analysis by extending theory previously developed for push-push and triple-push oscillators, and power amplifiers, to a quadruple-push oscillator. Note that, in this description the terms "even mode" and "common mode" are used interchangeably to refer to the same circuit condition. Similarly, "odd mode" and "differential mode" are used interchangeably to refer to the same circuit condition.

Figure 3:
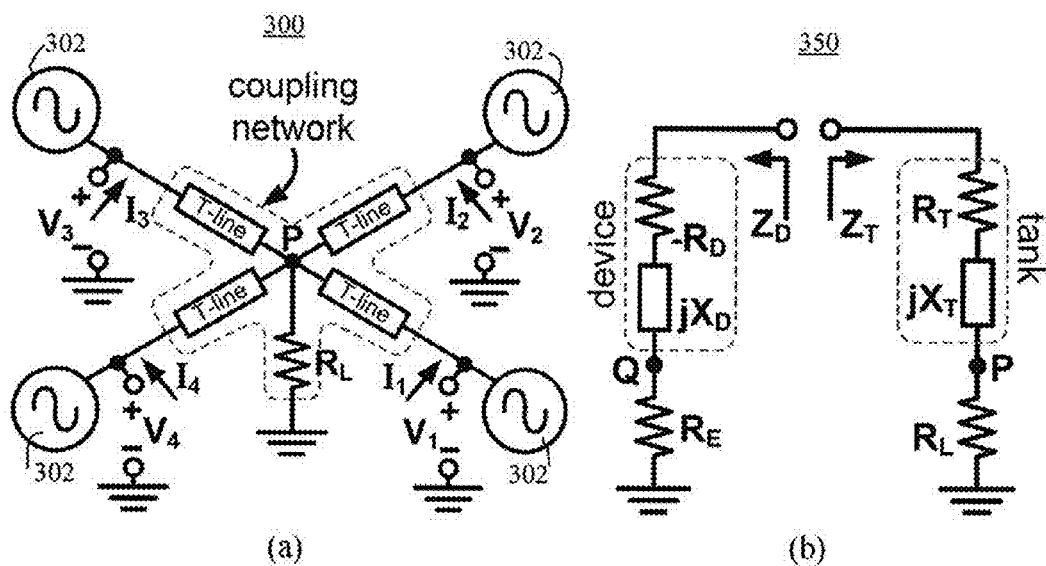
FIG. 3a is a block diagram of the quadrature oscillator illustrating port definitions.
FIG. 3b is an equivalent circuit diagram of the quadrature oscillator.

Referring to FIG. 3a, a block diagram illustrating port definitions of the quadrature oscillator 200 is illustrated generally by numeral 300. In this block diagram 300, the quadrature oscillator 200 is represented as a four-port circuit. Each of the four Colpitts circuits, including their common-mode resistors $R_{Diff}$, is illustrated as a separate sub-oscillator 302. All four sub-oscillators 302 are coupled via a network that comprises transmission lines T-line and a load resistor $R_L$. The voltage, current, and impedance phasors (magnitude and phase) of the quadruple-push oscillator topology are related by the following matrix equation: $[Z][I]=[V]$. Taking into account the symmetries that exist in the circuit, it can be determined that $Zij=Zji$ for $ij=1\ldots4$ and $Z_{12}=Z_{14}=Z_{23}=Z_{34}$, $Z_{13}=Z_{24}$, and $Z_{11}=Z_{22}=Z_{33}=Z_{44}$. Accordingly, the matrix equation can be recast as:

$$\begin{bmatrix} Z_{11} & Z_{12} & Z_{13} & Z_{12} \\ Z_{12} & Z_{11} & Z_{12} & Z_{13} \\ Z_{13} & Z_{12} & Z_{11} & Z_{12} \\ Z_{12} & Z_{13} & Z_{12} & Z_{11} \end{bmatrix} \begin{bmatrix} I_1 \\ I_2 \\ I_3 \\ I_4 \end{bmatrix} = \begin{bmatrix} V_1 \\ V_2 \\ V_3 \\ V_4 \end{bmatrix} \quad \text{(Equation 1)}$$

The eigenvectors and eigenvalues of Equation 1 represent all the oscillation modes of the circuit. The eigenvalues obtained can be obtained by solving Equation 1 using the eigenvectors for each of a common mode, odd mode and quadrature mode as shown in Table 1 below.

TABLE 1

| Mode | Eigenvector | Eigenvalue |
|---|---|---|
| Even | $\begin{bmatrix} I_1 \\ I_2 \\ I_3 \\ I_4 \end{bmatrix} = \begin{bmatrix} 1 \\ 1 \\ 1 \\ 1 \end{bmatrix}$ | $Z_e = Z_{11} + 2Z_{12} + Z_{13}$ |
| Odd | $\begin{bmatrix} I_1 \\ I_2 \\ I_3 \\ I_4 \end{bmatrix} = \begin{bmatrix} 1 \\ -1 \\ 1 \\ -1 \end{bmatrix}$ | $Z_o = Z_{11} - 2Z_{12} + Z_{13}$ |
| Quadrature | $I_1 + I_2 + I_3 + I_4 = 0$ | $Z_q = Z_{11} - Z_{13}$ (double root) |

In each oscillation mode, the phases and relative amplitudes of the signals produced by the sub-oscillators 302 are represented by the elements of the eigenvector that describes that mode. For example, the values of $I_1=1$ and $I_2=-1$ in the odd mode, illustrate that sub-oscillators 1 and 2 produce signals of equal amplitude which are 180° out of phase. The impedance seen at the ports of the oscillator in a particular mode is given by the eigenvalue corresponding to that mode.

The quadrature oscillation mode is described by two eigenvectors which satisfy the equation $I_1+I_2+I_3+I_4=0$ and, at the same time, comply with the symmetry of the circuit. The symmetry requires having equal-amplitude oscillations in all four sub-circuits. The two eigenvectors are $$\begin{bmatrix} I_1 \\ I_2 \\ I_3 \\ I_{41} \end{bmatrix} = \begin{bmatrix} 1 \\ e^{j\frac{\pi}{2}} \\ e^{j\pi} \\ e^{j\frac{3\pi}{2}} \end{bmatrix}, \begin{bmatrix} I_1 \\ I_2 \\ I_3 \\ I_{41} \end{bmatrix} = \begin{bmatrix} 1 \\ e^{-j\frac{\pi}{2}} \\ e^{-j\pi} \\ e^{-j\frac{3\pi}{2}} \end{bmatrix} \quad \text{(Equation 2)}$$

In order to establish correct circuit operation, the even and odd mode oscillations must be suppressed and the quadrature oscillation mode must be amplified. The conditions for quadrature oscillation modes can be derived by inspecting any of sub-oscillators 302 separately.

Referring to FIG. 3b, an equivalent circuit for one of the sub-oscillators 302 is illustrated generally by numeral 350. In this circuit, the sub-oscillator 302 is modeled as a single-port. Looking to the left, the impedance $Z_D$ includes the impedance of the negative device resistance—$R_D$ in series with $R_E$, which represents the combination of $R_{Diff}$ and $R_{Quad}$, shown in FIG. 2. Looking to the right, the impedance $Z_T$, includes the impedance of the tank inductors in series with the load resistance $R_L$.

Figure 4:
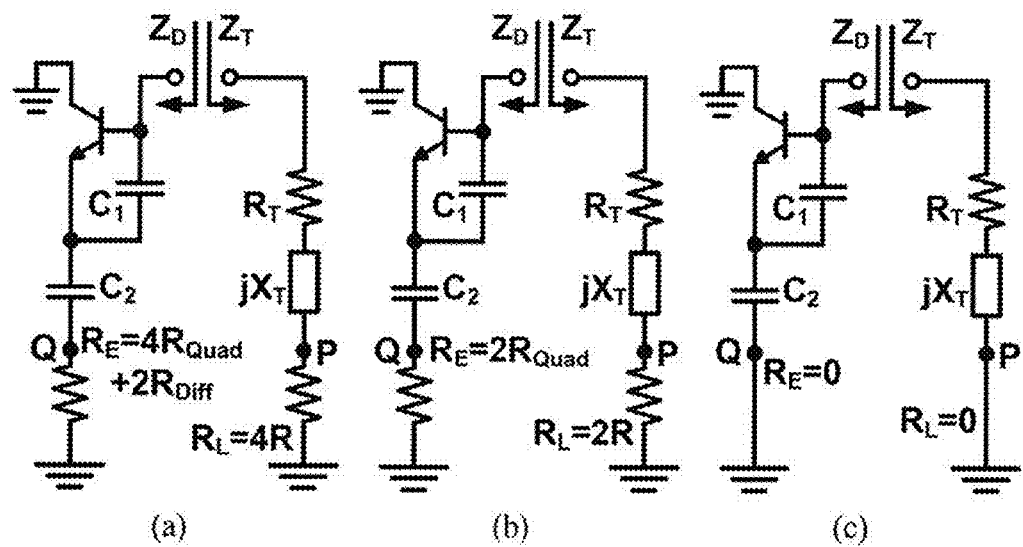
FIG. 4 is an equivalent circuit diagram for the even, odd and quadrature modes of the oscillator.

Referring to FIG. 4a-c, equivalent circuit models for the even mode, odd mode and quadrature mode are shown generally by numerals 400, 430 and 460, respectively. Note that both nodes Q and P are common to all four sub-oscillators 302.

As shown in FIG. 4c, in the quadrature oscillation mode, $R_E=R_L=0$ because nodes Q and P appear as virtual grounds.

As shown in FIG. 4b, in the odd mode of oscillation, $R_E=2R_{Quad}$ and $R_L=2R$. In the odd, or differential, oscillation mode the waveforms across $R_{Diff}$ are out of phase by 180°, the resistors $R_{Diff}$ are canceled out. However, two waveforms are in phase across $R_{Quad}$ and $R_L$, so their values are doubled.

As shown in FIG. 4a, in the even mode of oscillation, $R_E=4R_{Quad}+4R_{Quad}$ and $R_L=4R$. In the even, or common, oscillation mode, all sub-oscillators are in phase.

The conditions for suppressing even mode, odd mode oscillations and suppressing quadrature mode oscillations are given in equations 3 to 6, below. The equations are simplified using the value for RE and RL described with reference to FIG. 4.

Even Mode:

$$\Re\{Z_{eD}+Z_{eT}\}>0$$

$$\Re\{-R_D+jX_D+4R_{Quad}+2R_{Diff}+R_T+jX_T+4R\}>0$$

$$-R_D+4R_{Quad}+2R_{Diff}+R_T+4R>0 \quad \text{(Equation 3)}$$

Odd Mode:

$$\Re\{Z_{oD}+Z_{oT}\}>0$$

$$\Re\{-R_D+jX_D+2R_{Quad}+R_T+jX_T+2R\}>0$$

$$-R_D+2R_{Quad}+R_T+4R>0 \quad \text{(Equation 4)}$$

Quadrature Mode:

$$\Re\{Z_{qD}+Z_{qT}\}<0$$

$$\Re\{-R_D+jX_D+R_T+jX_T\}<0$$

$$-R_D+R_T<0 \quad \text{(Equation 5)}$$

$$\Im\{Z_{qD}+Z_{qT}\}=0$$

$$\Im\{-R_D+jX_D+R_T+jX_T\}=0$$

$$jX_D+jX_T=0 \quad \text{(Equation 6)}$$

From the inequalities described in Equations 3-5, the quadrature oscillation condition can be rewritten as:

$$R_T<|-R_D|<R_T+2R+2R_{Quad} \quad \text{(Equation 7)}$$

$$jX_D+jX_T=0 \quad \text{(Equation 6)}$$

It should also be noted that, although the roles of $R_{Diff}$ and $R_{Quad}$ are not immediately apparent from the model illustrated in FIG. 3a, from the equations described above, it is clear that they play a role in determining the phases of the oscillator outputs in a circuit implementation.

Since the order of the entries of the quadrature-mode eigenvectors illustrated in Equation 2 can be interchanged without affecting the solution, $R_{Diff}$ and $R_{Quad}$ assist with establishing the phase relationships of the four outputs. That is, establishing which output is 0°, which output is 90°, which output is 180° and which output is 270°.

Furthermore, $R_{Diff}$ and $R_{Quad}$ assist suppressing the odd and even oscillation modes by significantly degrading the Q factor of the capacitor C2 in FIGS. 4a and 4b.

Figure 5:
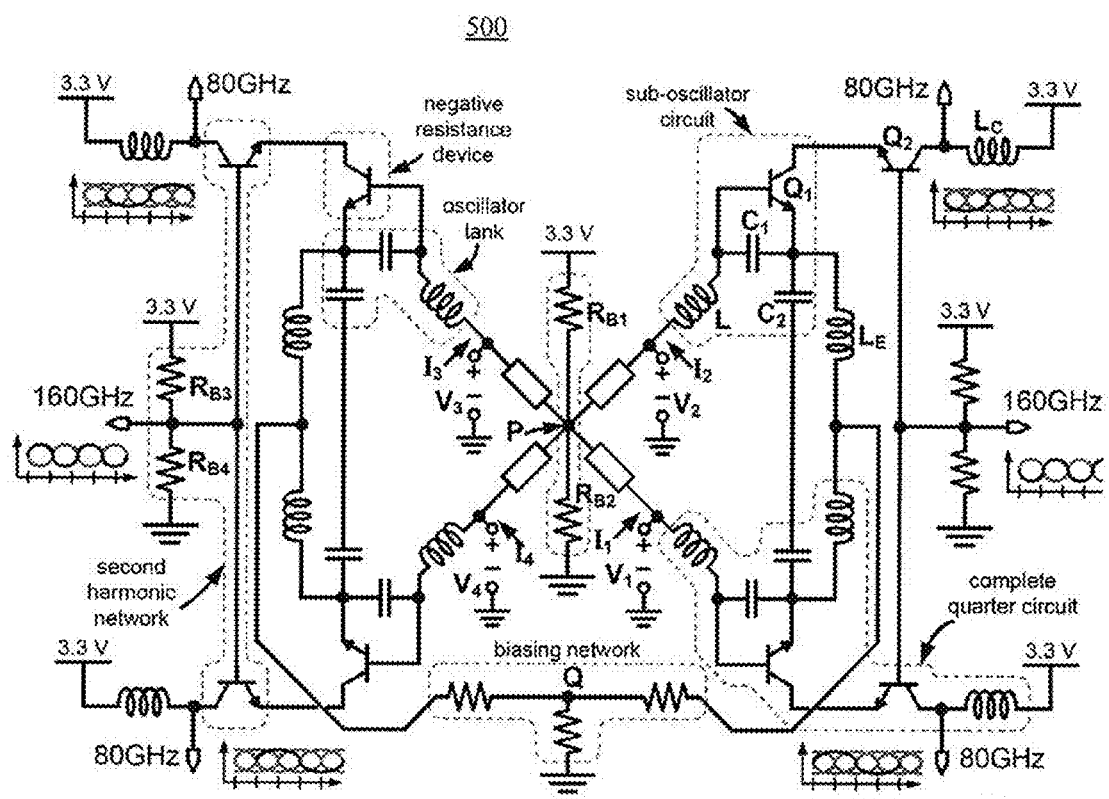
FIG. 5 is a circuit diagram of a quadrature oscillator in accordance with an embodiment of the invention.

Referring to FIG. 5, an quadrature oscillator designed for quadrature operation at a fundamental frequency of 80 GHz is illustrated generally at numeral 500. The quadrature oscillator is based on the concepts described above and comprises four quarter-circuits coupled via corresponding tank inductors in a star configuration. Each quarter circuit further includes a pair of cascode-coupled transistors configured to sufficiently isolate output signals of the quadrature oscillator from the tank inductors. A second harmonic circuit is configured to generate second harmonics signals from the fundamental frequency, and a biasing network configured to tune the oscillator.

Since AMOS varactors were not available in this technology (SiGe), the quadrature oscillator 500 was initially designed to operate at a constant frequency. However, more recent work in CMOS illustrates that it is straightforward to extend the quadrature oscillator described herein to a voltage-tunable version.

In this design, the load resistor $R_L$, illustrated in FIG. 3a, which is where the fourth harmonic signal is produced, is implemented using the bias resistors $R_{B1}$ and $R_{B2}$. The cascode transistors are employed to adequately isolate the quadrature outputs from the oscillator tank. They also allow combining the two differential 80-GHz signals into two second-harmonic signals at 160 GHz that are 180° out of phase.

Figure 6:
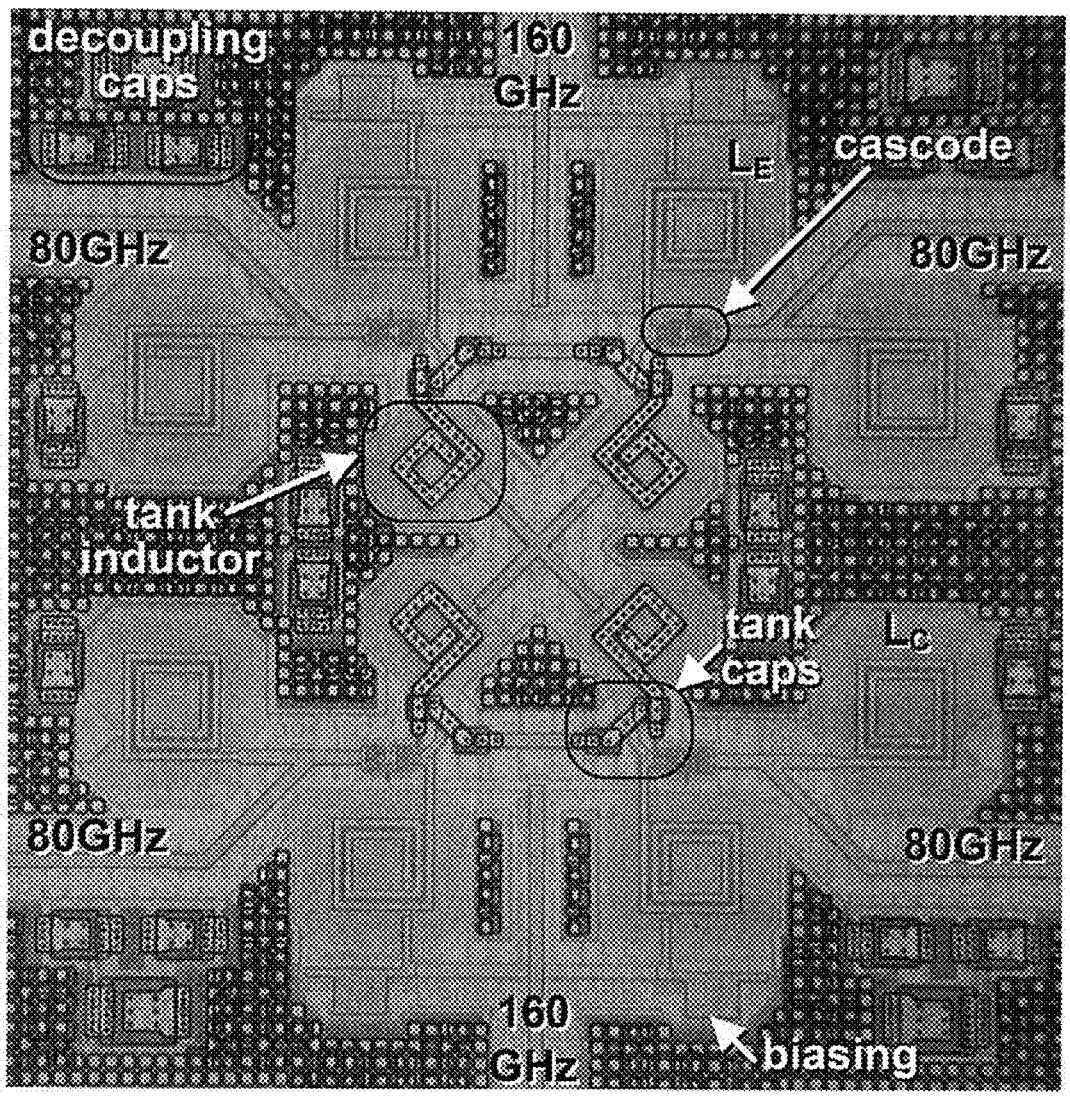
FIG. 6 is a picture of the topology of the quadrature oscillator in FIG. 5.

In the present embodiment, all transistors in the quadrature oscillator 500 are biased at the peak-$f_T$ current density of 14 mA/$\mu$m$^2$ to obtain the maximum output swing. Particular attention was paid to the symmetry of the oscillator layout, both for differential and for quadrature signals, as is illustrated in FIG. 6. The oscillator operates from 3.3 V, and consumes a total of 70 mA.

Mixer

Figure 7:
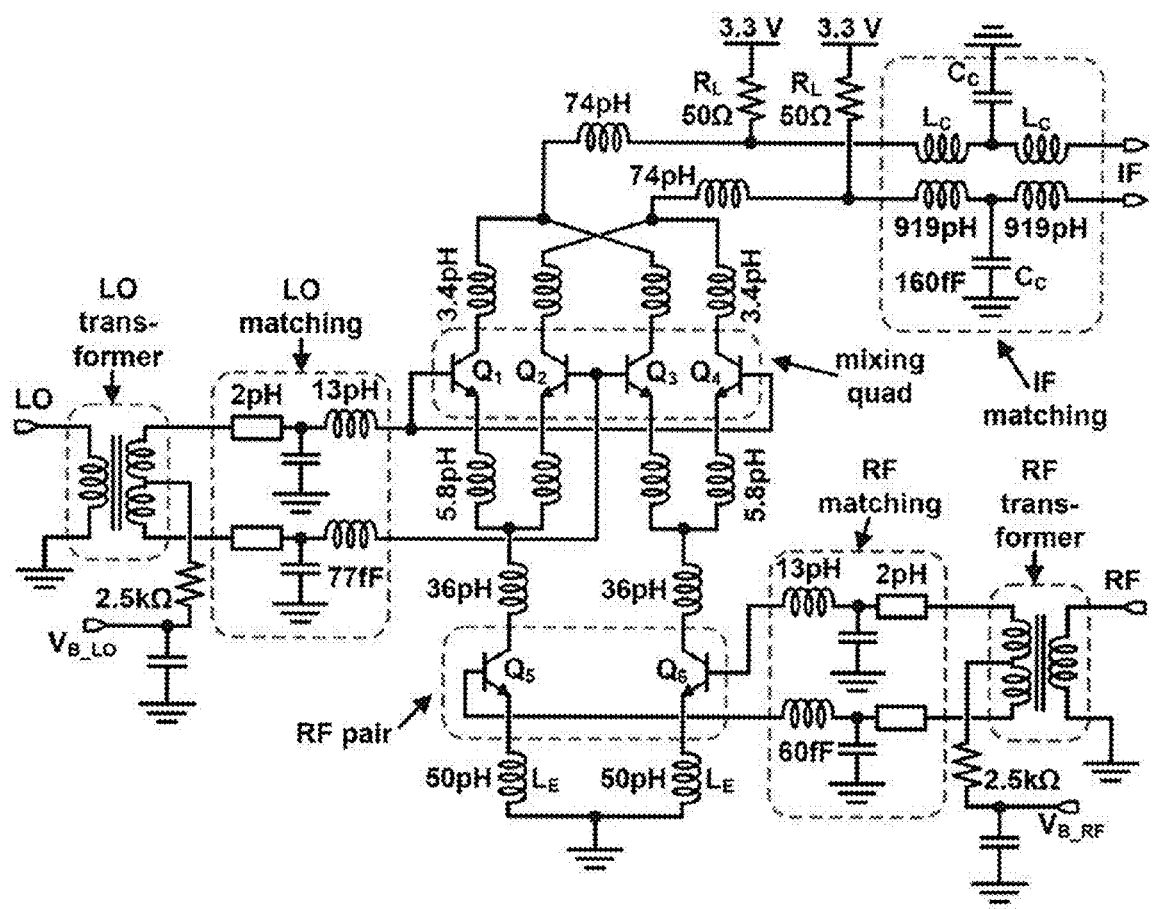
FIG. 7 is a circuit diagram of a mixer.

Referring to FIG. 7, the mixer is illustrated in greater detail. As will be appreciated by a person of ordinary skill in the art, the mixer comprises a double-balanced Gilbert cell topology. The mixer includes a LO balun, a RF balun an RF pair, a mixing quad, a pair of inductors $L_E$ and an IF matching circuit. The LO balun includes a LO transformer and a LO matching circuit. The RF balun includes a RF transformer and a RF matching circuit.

The LO and RF baluns perform single-ended to differential conversion on the signal received from the quadrature oscillator and the received RF signal, respectively. The bias $V_{B\_LO}$ for the LO differential pair is applied to a center tap of a secondary coil of LO transformer. Similarly, the bias $V_{B\_RF}$ for the RF differential pair is applied to a center tap of a secondary coil of RF transformer.

The inductors $L_E$ are used instead of a current source to achieve larger voltage headroom, better linearity, and help to match the RF input to 50Ω at 160 GHz. A 36 pH inductor is inserted in series between the collectors of each of the RF pair transistors and the emitters of the mixing quad to suppress the second harmonic (320 GHz) of the RF and LO signals over a broad band.

The LO matching circuit and the RF matching circuit reduce the reactance of the LO and RF inputs respectively by employing shunt capacitors and series inductive transmission lines, which are part of the interconnect.

The mixer schematic further includes several inductors that model interconnect lines in the mixer itself. Lines over the silicon substrate are modeled using the inductor 2–π model, while interconnects that passes over metal are described as transmission lines. Furthermore, metal-to-metal overlap capacitances are extracted using ASITIC and are included in the schematic. However, not all capacitances are illustrated for clarity.

In the present embodiment, there is no amplifier at the differential IF output. Instead, the IF matching circuit and on-chip 50Ω resistors are used to match the differential IF output to 50Ω at each side over a broad bandwidth (DC to 10 GHz). A broad IF bandwidth is required for some embodiments, where communications are at data rates above 10 Gb/s and in applications such as radio astronomy and passive imaging. Accordingly, for each of the differential IF outputs, the IF matching circuit includes two identical inductors $L_C$ rather than a single large inductor. Such a configuration increases the self-resonance frequency of those inductors beyond 50 GHz. Shunt capacitors $C_C$ tune the impedance to 50Ω.

Figure 8:
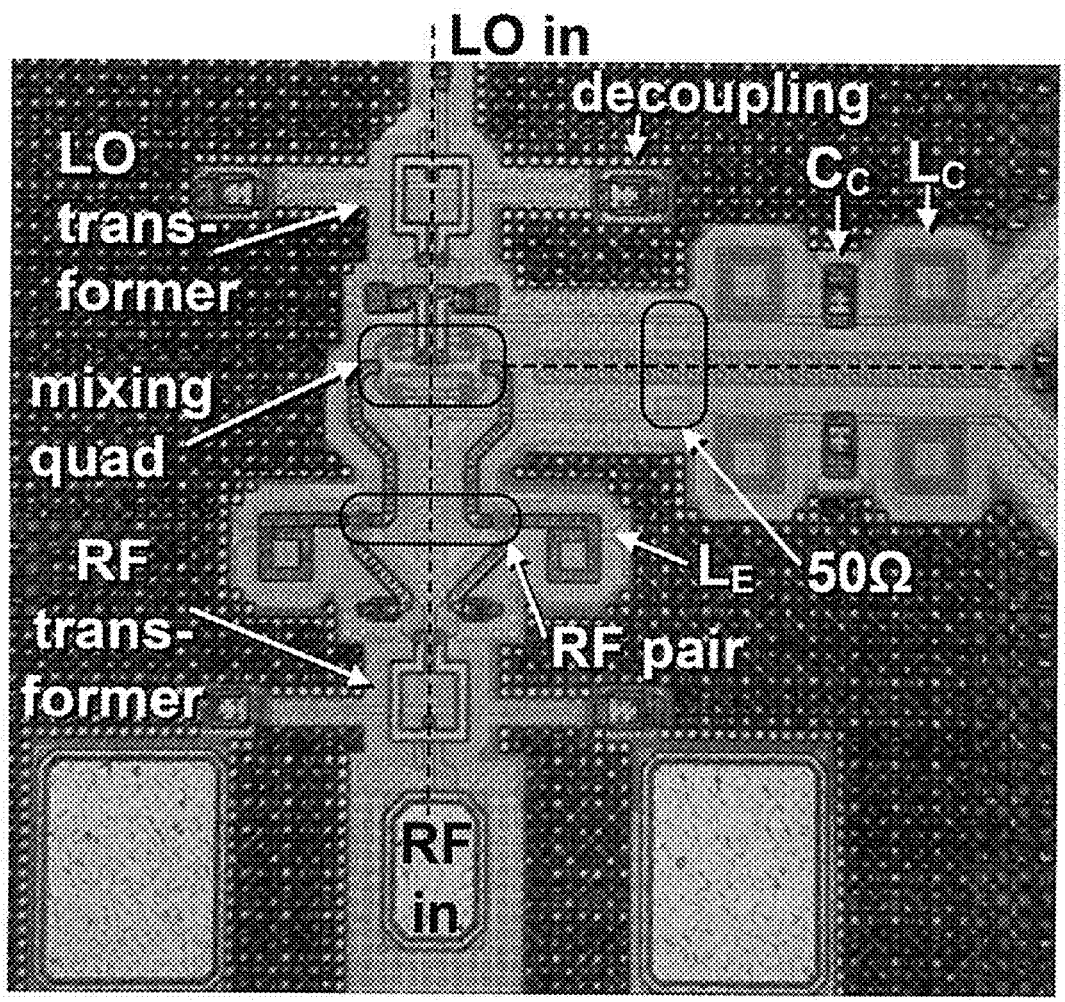
FIG. 8 is a picture of the topology of the mixer in FIG. 7

Referring to FIG. 8, a layout snapshot of the mixer is illustrated generally by numeral 800. The mixer layout 800 is fully symmetric with respect to the LO-to-RF line. Symmetry supports proper double-balanced mixing operation, impedance matching, and achieving high isolation at mm-wave frequencies. The mixer operates from 3.3 V and consumes 15 mA. In the present embodiment, the transistors are the same size ($l_E$=4 μm, $w_E$=0.13 μm) and are biased at the peak-$f_T$ current density of 14 mA/μm². Thanks, at least in part, to its balanced multiplier structure, this mixer works up to a 180 GHz.

Figure 9:
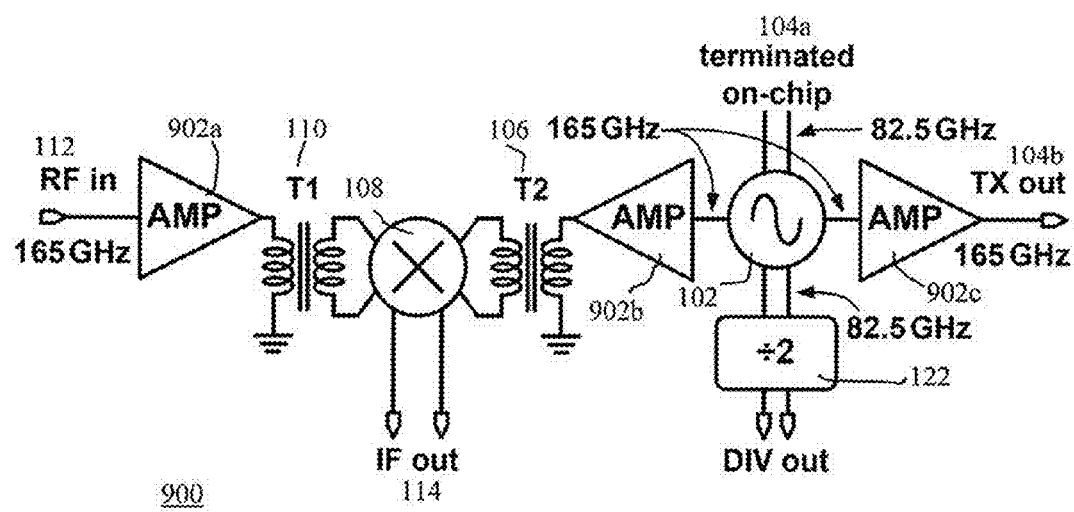
FIG. 9 is a block diagram of an alternate embodiment of the transceiver shown in FIG. 1.

Referring to FIG. 9, an alternate embodiment of the transceiver is illustrated by numeral 900. The transceiver illustrated in FIG. 9 shares a number of common features to the transceiver 100 illustrated in the previous embodiment. However, in the present embodiment, several amplifiers 902 are included in the transceiver 900 as well as a static divider 904.

Specifically, a RF amplifier 902a, a LO amplifier 902b and an output amplifier 902c are provided. The RF amplifier 902a is configured to amplify the received RF signal before it is passed to the received signal transformer. The LO amplifier 902b is configured amplify the output of the quadrature oscillator signal before it is passed to the out signal transformer. The output amplifier 902c is configured to amplify the output of the quadrature oscillator signal before it is transmitted from the transceiver 900. Each of the amplifiers 902 comprises a tuned, five-stage 180 GHz amplifier. A center frequency of the amplifiers 902 tuned at this frequency was measured to be 170 GHz.

Figure 10:
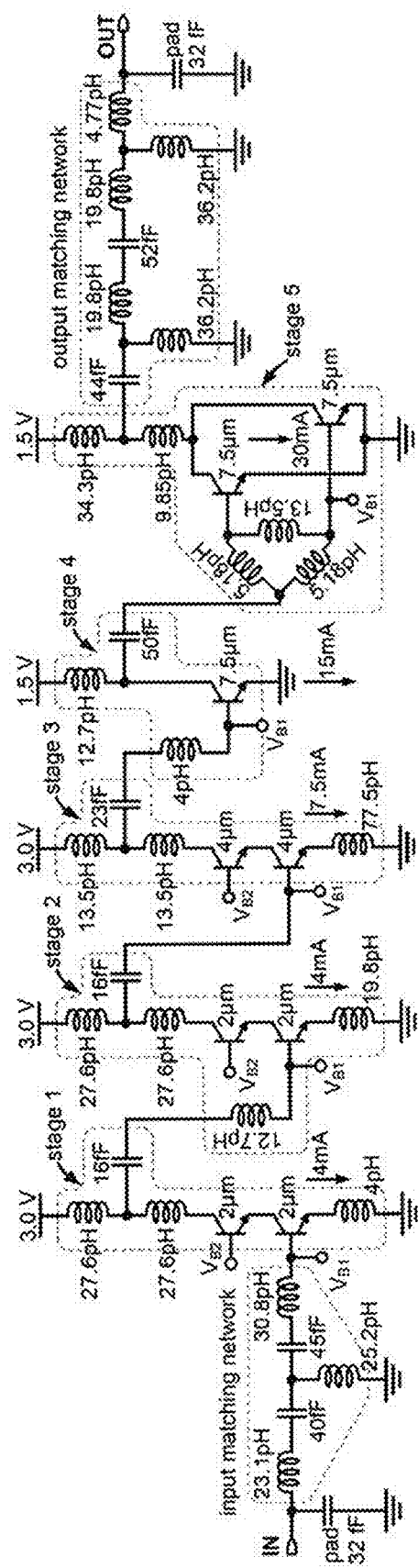
FIG. 10 is a circuit diagram of a five-stage amplifier illustrated in FIG. 9

Referring to FIG. 10, a schematic of a five-stage amplifier is illustrated generally by numeral 1000. In addition for the five stages, the amplifier 1000 includes an input matching circuit 1002 and an output matching circuit 1004.

The amplifier design described herein begins at the last stage and steps backwards towards the input. The bias current and size of transistors in each stage are progressively scaled (increasingly) from the input to the output. Inter-stage matching is employed to maximize power gain. The last two stages of the amplifier employ a common-emitter topology for higher output power, while the first 3 stages are implemented with using a cascode-based topology to obtain larger gain.

The fifth stage comprises common-emitter transistor biased at 30 mA to obtain a +2 dBm (0.8 $V_{PP}$) signal in a 50Ω load. Due to the large current that has to flow through this stage and its metallization, it has been implemented using two transistors connected in parallel, each with an emitter length of 7.5 μm. The pieces of interconnect leading to the parallel-connected devices are shown in the schematic as 5.18 pH inductors.

The load of the fifth stage is split in two to provide space in the layout for the load and for the output matching circuit 1004. The last stage has an input impedance of 7Ω–j2.2Ω, which is conjugately matched to the output of the fourth stage.

The fourth stage also comprises a common-emitter transistor with an inductive load, whose emitter length and bias current are scaled down by a factor of 2 compared to the fifth stage. The fourth stage presents an impedance of 13Ω–j4.3Ω to the third stage.

Each of the first, second and third stages comprise a cascode-based transistor configuration including a plurality series and shunt inductors, and a series capacitor. A split inductive load is employed in each of the first, second and third stages.

The bias current and emitter length of each preceding stage are scaled by a factor of half from the output towards the input. All transistors are biased at the peak-$f_T$ current density. This choice of biasing and transistor sizing help maximize the power transfer between stages because the real part of the impedance $Z_{IN}$ of each stage is approximately equal to the $Z_{OUT}$ of the previous stage. At the same time, the imaginary part (which is smaller than the real part) is cancelled using inter-stage series capacitors.

In a similar way, the first stage is matched to 50Ω, which is approximately equal to $R_B$+$R_E$, without requiring inductive degeneration. To minimize gain variability, all inductors were implemented with identical geometry and size ratios.

Conclusion

The transceiver described herein details highly integrated radio transceivers in silicon at frequencies above 100 GHz. Moreover, good performance is achieved up to 180 GHz, a factor of two larger than in any other silicon transceiver of comparable complexity, using design methodologies, circuit topologies, lumped inductors and transformers commonly employed below 10 GHz.

As described above, two 160 GHz transceivers were designed and fabricated. The first transceiver, which comprises an 80 GHz quadrature oscillator with differential 160 GHz outputs, a 160 GHz Gilbert cell mixer, and 70 GHz to 180 GHz transformers, proved the feasibility of a push-push differential oscillator capable of driving a double-balanced mixer differentially at 160 GHz while simultaneously transmitting at 80 GHz and 160 GHz.

The second transceiver employs the same oscillator and mixer, but also includes 170-GHz amplifiers on the receive, transmit, and LO paths, and a static frequency divider.

The amplifiers increased the down-conversion gain and transmitter output power of the second transceiver from −23.5 dB to −3 dB, and from −10 dBm to −3.5 dBm, respectively, when compared to the transceiver without amplifiers. Furthermore, its oscillator simultaneously drives two amplifiers at 165 GHz and a static frequency divider at 82.5 GHz, demonstrating an efficient solution to the LO distribution problem in 80+ GHz transceiver arrays.

Accordingly, the transceiver and its components as described herein pave the way for higher levels of integration at frequencies above 100 GHz by making it feasible to integrate mm-wave imaging arrays in silicon.

It thus becomes feasible to integrate arrays of mm-wave transceivers and a large digital signal processor (DSP) core on a single die. For example, in one application, transceiver arrays are needed in imagers based on inverse scattering.

The imager would operate in the 60 GHz to 160 GHz range and consist of a transceiver array implemented using SiGe BiCMOS or CMOS technology, as described above. The entire transceiver array, or groups of transceivers can be fabricated on a single silicon die.

Figure 11:
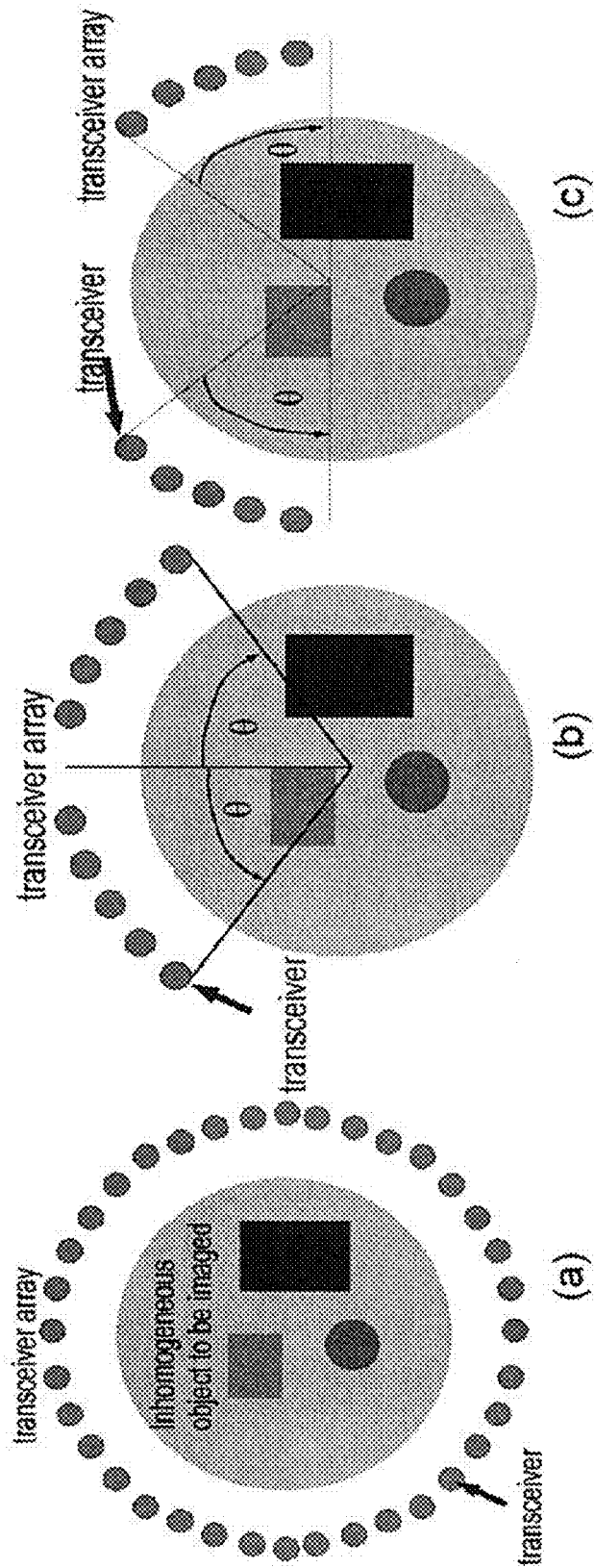
FIG. 11 is a block diagram of a transceiver array for a plurality of transceivers in an imaging application.

Each transceiver has at least one associated antenna integrated on the silicon die or in a package. The imager can be used to reconstruct a 3-D image of an inhomogeneous object based on an inverse scattering algorithm. Referring to FIG. 11, possible configurations of the transceiver array located around the imaged object are illustrated.

At any one time, one transceiver emits with its VCO operating on frequency $f_{TX}$ while the other transceivers are in receive mode with their VCO frequency set to $f_{RX}$. In order to be practical, these SOCs must first inhibit the cross-talk between adjacent transceivers.

To reduce the effect of these and other problems, each of transceivers illustrated in FIG. 11 have a frequency differing by an order of a few MHz, or even tens of MHz, between transmit and receive modes of operation. Each receiver thus operates with an IF frequency $f_{IF}=|f_{TX}-f_{RX}|$ allowing for the simple filtering of its own transmitter leakage signal and avoiding large 1/f noise at IF frequencies below 1 MHz. To further save power, the power amplifier of each transceiver in the imager array is turned off when the transceiver operates in receive mode.

Thus for example, a transmitting transceiver can be tuned to 160 GHz and receiving transceivers can be tuned to 161 GHz. Accordingly, the IF frequency of interest would be 1 GHz. Accordingly, a circuit can be designed and implemented to isolate and enhance the signal around 1 GHz so that the imaging information can be retrieved. Leakage signal from the transmitting transceiver will be filtered out from its own receiver because the IF frequency would be around zero.

Further, it is possible that each different transceiver can operate at a different frequency and the IF frequency of interest determined based on the transmitting transceiver and each receiving transceiver.

Although the invention has been described with reference to certain specific embodiments, various modifications thereof will be apparent to those skilled in the art without departing from the scope of the invention as defined by the appended claims.

The invention claimed is:

1. A system-on-chip (SOC) transceiver configured to operate in excess of 100 GHz, the transceiver comprising:
   a quadrature oscillator configured to generate a fundamental frequency and a second harmonic frequency and comprising at least a pair of high frequency outputs at said second harmonic frequency, wherein at least the second harmonic frequency exceeds 100 GHz;
   a transmission output coupled to one of the high frequency outputs for transmitting an output signal at said second harmonic frequency;
   a transmission signal transformer coupled to the other one of the high frequency outputs, the transmission signal transformer configured to generate a differential oscillator signal at the second harmonic frequency;
   a radio frequency input for receiving radio frequency signals at the transceiver from an antenna;
   a radio frequency signal transformer coupled to the radio frequency input, the radio frequency transformer configured to generate a differential radio frequency signal at the radio frequency;
   a mixer configured to compare the differential radio frequency signal with the differential oscillator signal and output the comparison as an intermediate frequency signal.

2. The transceiver of claim 1, further comprising at least one amplifier configured to amplify one or more of the signals in the transceiver.

3. The transceiver of claim 2 wherein the at least one amplifier includes at least one of:
   a radio frequency amplifier configured to amplify the radio frequency signal before it is input to the radio frequency signal transformer;
   a local oscillator amplifier configured to amplify the high frequency output before it is input to the transmission signal transformer; or
   an output amplifier configured to amplify the high frequency output before it is transmitted by the receiver.

4. The transceiver of claim 3, wherein each amplifier comprises a five-stage amplifier, an input matching circuit and an output matching circuit.

5. The transceiver of claim 4, wherein a first three of the five stages comprise cascode-configured transistors to improve gain and a last two of the five stages comprise a common-emitter transistor configuration to provide high power output.

6. The transceiver of claim 5, wherein the last of the five stages includes a pair of transistors coupled in parallel.

7. The transceiver of claim 1, wherein the quadrature oscillator is a Colpitts topology comprising four quarter-circuits coupled via corresponding tank inductors in a star configuration, each quarter circuit further including a pair of cascode-coupled transistors configured to sufficiently isolate output signals of the quadrature oscillator from the tank inductors; a second harmonic circuit configured to generate second harmonics signals from the fundamental frequency and a biasing network configured to tune the oscillator.

8. The transceiver of claim 1, wherein the intermediate frequency signal is a differential signal.

9. A transceiver array comprising a plurality of transceivers as defined in claim 1, each of the transceivers configured to operate at a transmitting frequency when in transmission mode and at a receiving frequency when in receiving mode.

10. The transceiver array of claim 9, wherein each transceiver is further configured to filter the intermediate frequency signal at a frequency that is the difference between the transmitting frequency and the receiving frequency.

11. The transceiver array of claim 10, wherein the filtered intermediate frequency signal is enhanced for retrieving data carried on the signal.

* * * * *